(12) United States Patent
Chen et al.

(10) Patent No.: US 7,037,174 B2
(45) Date of Patent: May 2, 2006

(54) METHODS FOR REDUCING DELAMINATION DURING CHEMICAL MECHANICAL POLISHING

(75) Inventors: Yufei Chen, San Jose, CA (US);
Lizhong Sun, San Jose, CA (US);
Doohan Lee, San Jose, CA (US);
Wei-Yung Hsu, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 83 days.

(21) Appl. No.: 10/678,906

(22) Filed: Oct. 3, 2003

(65) Prior Publication Data

US 2004/0116052 A1 Jun. 17, 2004

Related U.S. Application Data

(60) Provisional application No. 60/416,078, filed on Oct. 3, 2002.

(51) Int. Cl.
*B49D 1/00* (2006.01)

(52) U.S. Cl. .............. 451/5; 451/11; 451/41; 451/285; 451/286; 451/287; 451/288

(58) Field of Classification Search .............. 451/5, 451/11, 41, 285, 286, 287, 288
See application file for complete search history.

(56) References Cited

U.S. PATENT DOCUMENTS 4,920,031 A   4/1990 Ohno et al.

(Continued)

FOREIGN PATENT DOCUMENTS

| EP | 1 006 166 | 6/2000 |
|---|---|---|
| EP | 1 011 131 | 6/2000 |
| EP | 1 085 067 | 3/2001 |
| EP | 1 093 161 | 4/2001 |
| EP | 1 104 020 | 5/2001 |
| EP | 1 116 762 | 7/2001 |
| EP | 1 125 999 | 8/2001 |

(Continued)

OTHER PUBLICATIONS

US 5,985,755, 11/1999, Bajaj et al. (withdrawn)

U.S. Appl. No. 09/569,968, filed May 11, 2000 (AMAT/4534).

Written Opinion from PCT International Preliminary Examining Authority for US/02/00062, dated May 12, 2003 (AMAT/5538.PCT).

*Primary Examiner*—Joseph J. Hail, III
*Assistant Examiner*—Shantese McDonald
(74) *Attorney, Agent, or Firm*—Moser, Patterson & Sheridan (57) ABSTRACT

Method and apparatus are provided for polishing substrates comprising conductive and low k dielectric materials with reduced or minimum substrate surface damage and delamination. In one aspect, a method is provided for processing a substrate including positioning a substrate having a conductive material form thereon in a polishing apparatus having a rotational carrier head and a rotatable platen, wherein the substrate is disposed in the rotational carrier head and the platen has a polishing article disposed thereon, rotating the first carrier head at a first carrier head rotational rate and rotating a platen at a first platen rotational rate, contacting the substrate and the polishing article, accelerating the first carrier head rotational rate to a second carrier head rotational rate and accelerating the first platen rotational rate to a second platen rotational rate, and polishing the substrate at the second carrier head rotational rate and at the second platen rotational rate.

31 Claims, 3 Drawing Sheets

U.S. PATENT DOCUMENTS

| | | | |
|---|---|---|---|
| 5,340,370 A | | 8/1994 | Cadien et al. |
| 5,676,587 A | | 10/1997 | Landers et al. |
| 5,693,563 A | | 12/1997 | Teong |
| 5,735,963 A | | 4/1998 | Obeng |
| 5,783,489 A | | 7/1998 | Kaufman et al. |
| 5,842,910 A | | 12/1998 | Krywanczyk et al. |
| 5,893,796 A | | 4/1999 | Birang et al. |
| 5,897,426 A | | 4/1999 | Somekh |
| 5,948,205 A | * | 9/1999 | Kodera et al. ......... 156/345.13 |
| 5,954,997 A | | 9/1999 | Kaufman et al. |
| 5,981,454 A | | 11/1999 | Small |
| 5,985,748 A | | 11/1999 | Watts et al. |
| 6,001,730 A | | 12/1999 | Farkas et al. |
| 6,068,879 A | | 5/2000 | Pasch |
| 6,074,949 A | | 6/2000 | Schonauer et al. |
| 6,083,840 A | | 7/2000 | Mravic et al. |
| 6,113,465 A | * | 9/2000 | Kim et al. .................. 451/41 |
| 6,117,775 A | | 9/2000 | Kondo et al. |
| 6,117,783 A | | 9/2000 | Small et al. |
| 6,132,294 A | * | 10/2000 | Lin .............................. 451/41 |
| 6,136,714 A | | 10/2000 | Schutz |
| 6,143,656 A | | 11/2000 | Yang et al. |
| 6,156,661 A | | 12/2000 | Small |
| 6,165,052 A | | 12/2000 | Yu et al. |
| 6,183,686 B1 | | 2/2001 | Bardus et al. |
| 6,184,141 B1 | * | 2/2001 | Avanzino et al. ........... 438/692 |
| 6,217,416 B1 | | 4/2001 | Kaufman et al. |
| 6,218,290 B1 | | 4/2001 | Schonauer et al. |
| 6,235,633 B1 | | 5/2001 | Jang |
| 6,258,721 B1 | | 7/2001 | Li et al. |
| 6,271,416 B1 | | 8/2001 | Takagaki et al. |
| 6,375,559 B1 | | 4/2002 | James et al. |
| 6,432,823 B1 | | 8/2002 | Huynh et al. |
| 6,435,945 B1 | | 8/2002 | Somekh |
| 6,444,569 B1 | | 9/2002 | Farkas et al. |
| 2001/0013506 A1 | | 8/2001 | Chamberlin et al. |
| 2002/0064769 A1 | | 5/2002 | Michnicket et al. |
| 2002/0090820 A1 | | 7/2002 | Sun et al. |
| 2003/0013306 A1 | | 1/2003 | Tsai et al. |
| 2003/0013387 A1 | | 1/2003 | Tsai |
| 2003/0022501 A1 | | 1/2003 | Tsai |
| 2003/0022801 A1 | | 1/2003 | Sun et al. |
| 2003/0029841 A1 | | 2/2003 | Moon |
| 2003/0036339 A1 | | 2/2003 | Bonner |
| 2003/0062833 A1 | | 4/2003 | Tsai et al. |
| 2003/0120927 A1 | | 6/2003 | Kim |

FOREIGN PATENT DOCUMENTS

| | | |
|---|---|---|
| FR | 1 603 558 | 6/1971 |
| JP | 2001-127018 | 5/2001 |
| JP | 2001-139937 | 5/2001 |
| KR | 2000-011709 | 2/2000 |
| WO | 98/04646 | 2/1998 |
| WO | 98/36045 | 8/1998 |
| WO | 98/44061 | 8/1998 |
| WO | 98/41671 | 9/1998 |
| WO | 98/49723 | 11/1998 |
| WO | WO 99/46081 | 9/1999 |
| WO | 00/00561 | 1/2000 |
| WO | WO 00/02235 | 1/2000 |
| WO | 00/02238 | 1/2000 |
| WO | 00/24842 | 5/2000 |
| WO | 00/30159 | 5/2000 |
| WO | 00/35627 | 6/2000 |

* cited by examiner

METHODS FOR REDUCING DELAMINATION DURING CHEMICAL MECHANICAL POLISHING

CROSS-REFERENCE TO RELATED APPLICATIONS

This application claims benefit of U.S. provisional patent application Ser. No. 60/416,078, filed Oct. 3, 2002, which is herein incorporated by reference.

BACKGROUND OF THE INVENTION

1. Field of the Invention

Aspects of the invention generally relate to the fabrication of semiconductor devices and to chemical mechanical polishing and planarization of semiconductor devices.

2. Description of the Related Art

Reliably producing sub-half micron and smaller features is one of the key technologies for the next generation of very large scale integration (VLSI) and ultra large-scale integration (ULSI) of semiconductor devices. However, as the fringes of circuit technology are pressed, the shrinking dimensions of interconnects in VLSI and ULSI technology has placed additional demands on the processing capabilities. The multilevel interconnects that lie at the heart of this technology require precise processing of high aspect ratio features, such as vias, contacts, lines, and other interconnects. Reliable formation of these interconnects is important to VLSI and ULSI success and to the continued effort to increase circuit density and quality of individual substrates and die.

In order to further improve the current density of semiconductor devices on integrated circuits, it has become necessary to use conductive materials having low resistivity for conductors and materials having low dielectric constant (low k, defined herein as having dielectric constants, k, less than about 4.0) as insulating layers to reduce the capacitive coupling between adjacent interconnects. Increased capacitative coupling between layers can detrimentally affect the functioning of semiconductor devices.

One conductive material gaining acceptance is copper and its alloys, which have become the materials of choice for sub-quarter-micron interconnect technology because copper has a lower resistivity than aluminum, (1.7 µΩ-cm compared to 3.1 µΩ-cm for aluminum), a higher current and higher carrying capacity. These characteristics are important for supporting the higher current densities experienced at high levels of integration and increased device speed. Further, copper has a good thermal conductivity and is available in a highly pure state.

One difficulty in using copper in semiconductor devices is that copper is difficult to etch in a precise pattern. Etching copper using traditional deposition/etch processes for forming interconnects has been less than satisfactory. Therefore, new methods of manufacturing interconnects having copper-containing materials and low k dielectric materials are being developed.

One method for forming vertical and horizontal interconnects is by a damascene or dual damascene method. In the damascene method, one or more dielectric materials, such as the low k dielectric materials, are deposited and pattern etched to form the vertical interconnects, i.e., vias, and horizontal interconnects, i.e., lines. Conductive materials, such as copper-containing materials, and other materials, such as barrier layer materials used to prevent diffusion of copper-containing materials into the surrounding low k dielectric, are then inlaid into the etched pattern. Any excess copper-containing materials and excess barrier layer material external to the etched pattern, such as on the field of the substrate, is then removed.

Planarizing a surface, or "polishing" a surface, is a process where material is removed from the surface of the substrate to form a generally even, planar surface. Planarization is useful in dual damascene processes to remove excess deposited material and to provide an even surface for subsequent levels of metallization and processing. Planarization may also be used in removing undesired surface topography and surface defects, such as rough surfaces, agglomerated materials, crystal lattice damage, scratches, and contaminated layers or materials.

Chemical mechanical planarization, or chemical mechanical polishing (CMP), is a common technique used to planarize substrates. In conventional CMP techniques, a substrate carrier or carrier head is mounted on a carrier assembly and positioned in contact with a polishing article in a CMP apparatus. The carrier assembly provides a controllable pressure to the substrate urging the substrate against the polishing article. The article is moved relative to the substrate by an external driving force. Thus, the CMP apparatus effects polishing or rubbing movement between the surface of the substrate and the polishing article while dispersing a polishing composition to effect both chemical activity and mechanical activity.

Conventionally, in polishing copper features, such as dual damascene features, the copper-containing material, and a portion of the barrier layer, is polished to the level of the barrier layer, and then the barrier layer is polished, with a portion of the dielectric layer and copper features, to the level of the underlying dielectric layer.

One difficulty that can occur in polishing copper features may arise when using low k dielectric material in copper dual damascene formation. Low k dielectric materials are typically soft, porous, or brittle. Current polishing pressures, greater than about 2 psi, can damage the low k dielectric material and form defects in the substrate surface, such as film delamination, due to high shear stresses caused by the friction between the polishing article and substrate surface. Additionally, conventional polishing processes contact the substrate and a polishing article at polishing conditions that impart high shear stresses. Such polishing conditions, including both polishing pressure and polishing article rotational rates, have been observed to and result in delamination of material from the substrate surface.

Therefore, there exists a need for an apparatus and method that reduce or minimize the formation of topographical defects and film delamination during processing.

SUMMARY OF THE INVENTION

Aspects of the invention relate generally to methods and apparatus for polishing substrates comprising conductive materials and/or low k dielectric films with reduced or minimum substrate surface damage and delamination. In one aspect, a method is provided for processing a substrate having a conductive material formed thereon including positioning the substrate in a polishing apparatus having a rotational carrier head and a rotatable platen, wherein the substrate is disposed in the rotational carrier head and the platen has a polishing article disposed thereon, rotating the first carrier head at a first carrier head rotational rate and rotating a platen at a first platen rotational rate, contacting the substrate with the polishing article at a polishing pressure of less than about 2 psi, accelerating the first carrier head rotational rate to a second carrier head rotational rate and accelerating the first platen rotational rate to a second platen rotational rate, and removing a substantial portion of the conductive material from the substrate at the second carrier head rotational rate and at the second platen rotational rate.

In another aspect, a method is provided for processing a substrate having a conductive material formed thereon including positioning the substrate in a rotational carrier head, rotating the rotational carrier head at a carrier head rotational rate of about 80 rpm or less, rotating a platen at a platen rotational rate of about 80 rpm or less, wherein the platen has a polishing article disposed thereon, contacting the substrate and the polishing article at a polishing pressure between about 0.1 psi and about 2 psi, rotating the rotational carrier head at a carrier head rotational rate between greater than about 120 rpm and about 500 rpm or less, rotating the platen at a platen rotational rate between greater than about 120 rpm and about 750 rpm or less, and removing a substantial portion of the conductive material from the substrate.

In another aspect, a method is provided for processing a substrate having a conductive material formed thereon including contacting the substrate with a polishing article at a polishing pressure of less than about 2 psi to remove a substantial portion of the conductive material, wherein the substrate is disposed in a carrier head having a first carrier head rotational rate and the substrate is contacted with a polishing material disposed on the platen having a first platen rotational rate, reducing the first carrier head rotational rate to a second carrier head rotational rate less than the first carrier head rotational rate, reducing the first platen rotational rate to a second platen rotational rate less than the first platen rotational rate, and removing the substrate from contact with the polishing material disposed on the platen.

In another aspect, a method is provided for processing a substrate having a conductive material formed thereon including positioning the substrate in a polishing apparatus having a rotational carrier head and a platen, wherein the substrate is disposed in the rotational carrier head and the platen has a polishing article disposed thereon, rotating the first carrier head at a first carrier head rotational rate and providing a first linear velocity, contacting the substrate with the polishing article at a polishing pressure of less than about 2 psi, accelerating the first carrier head rotational rate to a second carrier head rotational rate and accelerating the first linear velocity to a second linear velocity, and removing a substantial portion of the conductive material from the substrate at the second carrier head rotational rate and at the second linear velocity.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION OF THE PREFERRED EMBODIMENT

In general, aspects of the invention provide methods and apparatus for polishing substrates having conductive materials and low k dielectric films disposed thereon with reduced or minimum substrate surface damage and delamination. The invention will be described below in reference to a planarizing process for the removal of conductive materials, such as copper-containing materials, formed in feature definitions of low k dielectric materials by chemical mechanical polishing (CMP) techniques. Chemical mechanical polishing is broadly defined herein as polishing a substrate by a combination of both chemical and mechanical activity.

The planarizing process and composition that can used to polish a substrate disposed in chemical mechanical polishing process equipment, such as the Mirra® polishing system, the Mirra Mesa™ polishing system, the Reflexion® polishing system, and the Reflexion LK™ polishing system, all of which are available from Applied Materials, Inc., The Mirra® polishing system is further described in U.S. Pat. No. 5,738,574, entitled, "Continuous Processing System for Chemical Mechanical Polishing," the entirety of which is incorporated herein by reference to the extent not inconsistent with the invention.

The invention will be described below in reference to a planarizing process and a polishing article that can be performed on a chemical mechanical polishing system, such as a Reflexion™ CMP System available from Applied Materials, Inc., located in Santa Clara, Calif. Although, the polishing process and composition described herein is illustrated utilizing the Reflexion® CMP System, any system enabling chemical mechanical polishing, such as the Mirra Mesa™ polishing system, using the methods described herein can be used to advantage. The invention further contemplates that changes is process parameters may be required to perform the processes described herein on different apparatus.

Figure 1:
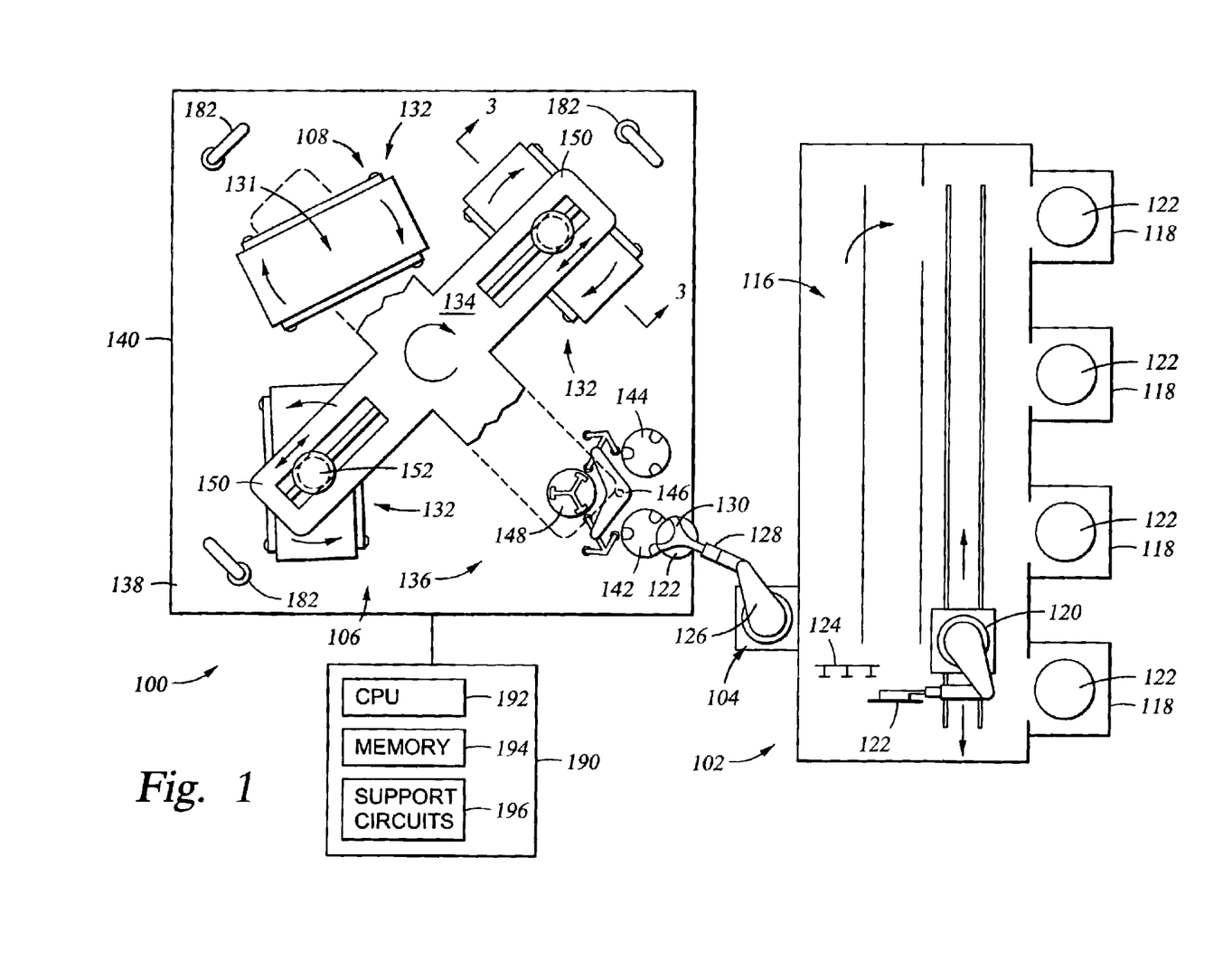
FIG. 1 is a plan view of one embodiment of a chemical mechanical planarization system of the invention.

FIG. 1 depicts a plan view of one embodiment of a chemical mechanical planarization system 100 generally having a factory interface 102, a loading robot 104, one or more polishing modules 106, and one or more lift assemblies 108. Generally, the loading robot 104 is disposed proximate the factory interface 102 and the polishing module 106 to facilitate the transfer of substrates 122 therebetween.

A computer based controller 190 is connected to the polishing system or apparatus 120 for instructing the system to perform one or more processing steps on the system, such as polishing a substrate or transferring a substrate in the polishing apparatus 120. In one embodiment, the invention may be implemented as a computer program-product for use with a computer system or computer based controller 190. The programs defining the functions of an embodiment can be provided to a computer via a variety of signal-bearing media and/or computer readable media, which include but are not limited to, (i) information permanently stored on non-writable storage media (e.g., read-only memory devices within a computer such as read only CD-ROM disks readable by a CD-ROM or DVD drive; (ii) alterable information stored on a writable storage media (e.g., floppy disks within diskette drive or hard-disk drive); or (iii) information conveyed to a computer by communications medium, such as through a computer or telephone network, including wireless communication. Such signal-bearing media, when carrying computer-readable instructions that direct the functions of the invention, represent alternative embodiments of the present invention. It may also be noted that portions of the product program may be developed and implemented independently, but when combined together are embodiments of the present invention.

The factory interface 102 generally includes a cleaning module 116 and one or more substrate cassettes 118. An interface robot 120 is employed to transfer substrates 122 between the substrate cassettes 118, the cleaning module 116 and an input module 124. The input module 124 is positioned to facilitate transfer of substrates 122 between the polishing module 106 and the factory interface 102 by the loading robot 104. For example, unpolished substrates 122 retrieved from the cassettes 118 by the interface robot 120 may be transferred to the input module 124 where the substrates 122 may be accessed by the loading robot 104 while polished substrates 122 returning from the polishing module 106 may be placed in the input module 124 by the loading robot 104. Polished substrates 122 are typically passed from the input module 124 through the cleaning module 116 before the factory interface robot 120 returns the cleaned substrates 122 to the cassettes 118. An example of such a factory interface 102 that may be used to advantage is disclosed in U.S. Pat. No. 6,361,422, issued Mar. 26, 2002, which is hereby incorporated by reference.

The loading robot 104 is generally positioned proximate the factory interface 102 and the polishing module 106 such that the range of motion provided by the robot 104 facilitates transfer of the substrates 122 therebetween. An example of a loading robot 104 is a 4-Link robot, manufactured by Kensington Laboratories, Inc., located in Richmond, Calif.

The exemplary loading robot 104 has an articulated arm 126 having a rotary actuator 128 at its distal end. An edge contact gripper 130 is coupled to the rotary actuator 128. The rotary actuator 128 permits the substrate 122 secured by the gripper 130 to be oriented in either a vertical or a horizontal orientation without contacting the feature side 120 of the substrate 122 and possibly causing scratching or damage to the exposed features. Additionally, the edge contact gripper 130 securely holds the substrate 122 during transfer, thus decreasing the probability that the substrate 122 will become disengaged. Optionally, other types of grippers, such as electrostatic grippers, vacuum grippers and mechanical clamps, may be substituted.

Polishing modules 106 including those that use polishing article, polishing webs, or a combination thereof may also be used to advantage. Other systems that benefit include systems that move a substrate relative a polishing surface in a rotational, linearly or in other motion within a plane.

The exemplary polishing module 106 has a transfer station 136, a plurality of polishing stations 132 and a carousel 134 disposed on an upper or first side 138 of a machine base 140. In one embodiment, the transfer station 136 comprises at least an input buffer station 142, an output buffer station 144, a transfer robot 146, and a load cup assembly 148. The loading robot 104 places the substrate 122 onto the input buffer station 142. The transfer robot 146 has two gripper assemblies, each having pneumatic gripper fingers that grab the substrate 122 by the substrate's edge. The transfer robot 146 lifts the substrate 122 from the input buffer station 142 and rotates the gripper and substrate 122 to position the substrate 122 over the load cup assembly 148, then places the substrate 122 down onto the load cup assembly 148. An example of a transfer station that may be used to advantage is described by Tobin in U.S. Pat. No. 6,156,124, issued Dec. 5, 2000, which is hereby incorporated by reference.

Figure 2:
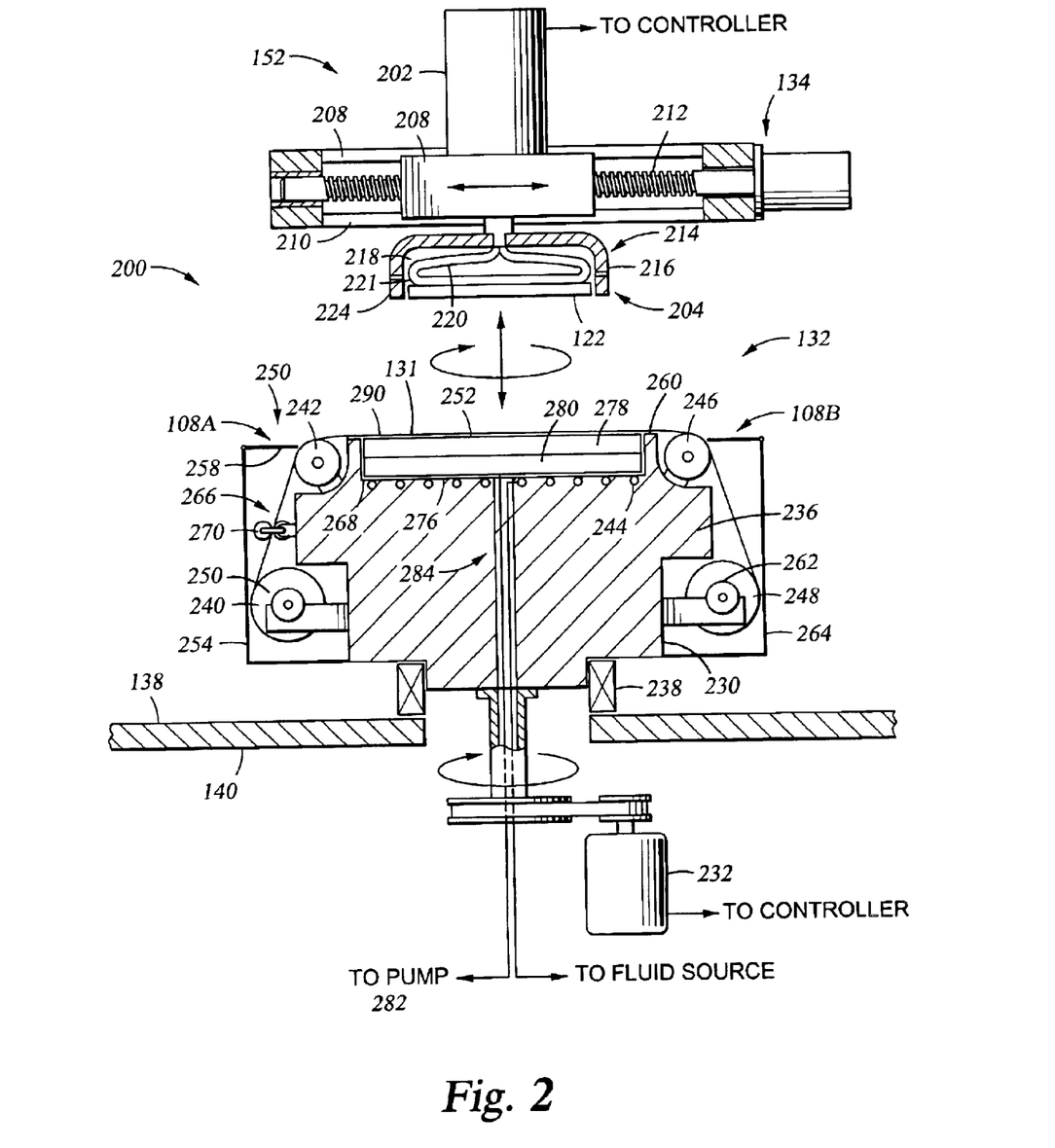
FIG. 2 is a sectional view of a polishing station taken along section line 3—3 of FIG. 1.

The carousel 134 is generally described by Tolles in the previously incorporated U.S. Pat. No. 5,804,507. Generally, the carousel 134 is centrally disposed on the base 140. The carousel 134 typically includes a plurality of arms 150, each supporting a polishing head assembly 152. Two of the arms 150 depicted in FIG. 2 are shown in phantom such that a polishing surface 131 of one of the polishing stations 132 and the transfer station 136 may be seen. The carousel 134 is indexable such that the polishing head assemblies 152 may be moved between the polishing stations 132 and the transfer station 136.

Generally, a chemical mechanical polishing process is performed at each polishing station 132. A conditioning device 182 is disposed on the base 140 adjacent each polishing station 132. The conditioning device 182 periodically conditions the polishing surface 131 to maintain uniform polishing results.

A computer based controller 190 is connected to the polishing system or apparatus 120 for instructing the system to perform one or more processing steps on the system, such as polishing a substrate or transferring a substrate in the polishing apparatus 120.

Although the process described herein is discussed as being implemented by a software routine, some or all of the method steps may be performed in hardware as well as by the software controller. As such, the invention may be implemented in software as executed upon a computer system, in hardware as an application specific integrated circuit or other type of hardware implementation, or a combination of software and hardware.

FIG. 2 depicts a sectional view of the polishing head assembly 152 supported above the polishing station 132. The polishing head assembly 152 generally comprises a drive system 202 coupled to a polishing head 204. The drive system 202 generally provides rotational motion to the polishing head 204. The polishing head 204 additionally may be actuated to extend towards the polishing station 132 such that the substrate 122 retained in the polishing head 204 may be disposed on the polishing station 132.

The drive system 202 is coupled to a carrier 208 that translates upon a rail 210 disposed in the arm 150 of the carousel 134. A ball screw or other linear motion device 212 couples the carrier 208 to the carousel 134 and positions the drive system 202 and polishing head 204 along the rail 210.

In one embodiment, the polishing head 204 is a TITAN HEAD™ substrate carrier manufactured by Applied Materials, Inc., Santa Clara, Calif. Generally, the polishing head 204 comprises a housing 214 having an extending lip 216 that defines a center recess 218 in which is disposed a bladder 220. The bladder 220 may be comprised of an elastomeric material or thermoplastic elastomer such as ethylene propylene, silicone and HYTREL™ polymer. The bladder 220 is coupled to a fluid source (not shown) such that the bladder 220 may be controllably inflated or deflated. The bladder 220, when in contact with the substrate 122, retains the substrate 122 within the polishing head 204 by deflating, thus creating a vacuum between the substrate 122 and the bladder 220. A retaining ring 224 circumscribes the polishing head 204 to retain the substrate 122 within the polishing head 204 while polishing.

Disposed between the polishing head assembly 154 and the polishing station 132 is polishing article, such as a web of polishing material 252. The web of polishing material 252 may have a smooth surface, a textured surface, or a combination of smooth and textured surfaces. For example, the web of polishing material may have a textured portion such as a center portion of the web or have a textured perimeter portion, while the remaining surface of the web is smooth. An example of a web of polishing material is described in co-pending patent application Ser. No. 10/159,183, filed on May 31, 2003, which is incorporated herein by reference to the extent not inconsistent with the disclosure and claimed aspects herein.

The polishing station 132 generally comprises a platen 230 that is disposed on the base 140. The platen 230 is typically comprised of aluminum. The platen 230 is supported above the base 140 by a bearing 238 so that the platen 230 may rotate in relation to the base 140. An area of the base 140 circumscribed by the bearing 238 is open and provides a conduit for the electrical, mechanical, pneumatic, control signals and connections communicating with the platen 230.

Conventional bearings, rotary unions and slip rings (not shown) are provided such that electrical, mechanical, pneumatic, control signals and connections may be coupled between the base 140 and the rotating platen 230. The platen 230 is typically coupled to a motor 232 that provides the rotational motion to the platen 230. The platen 230 may be rotated at a rotational speed between about 0 revolutions per minute (rpm), i.e., stationary, and about 10,000 rpm with variable rotational rates may be obtained through modifying the platen motor; and the carrier head may be rotated between about 0 revolutions per minute (rpm), i.e., stationary, and about 10,000 rpm with variable rotational rates may be obtained through modifying the carrier head motor.

The platen 230 has an upper portion 236 that supports the web of polishing material 252. A top surface 260 of the platen 230 contains a center recess 276 extending into the top portion 236. The top portion 236 may optionally include a plurality of passages 244 disposed adjacent to the recess 276. The passages 244 are coupled to a fluid source (not shown). Fluid flowing through the passages 244 may be used to control the temperature of the platen 230 and the polishing material 252 disposed thereon. The web of polishing material 252 may be in the form of a pad, roll or sheet of material that may be advanced across or releasably fixed to the polishing surface. Typically, the web of polishing material 252 is releasably fixed by adhesives, vacuum, mechanical clamps or by other holding methods to the platen 230.

A sub-pad 278 and a sub-plate 280 are disposed in the center recess 276. The sub-pad 278 is typically a polymeric material, such as polycarbonate or foamed polyurethane. Generally, the hardness or durometer of the sub-pad may be chosen to produce a particular polishing result. The sub-pad 278 generally maintains the polishing material 252 parallel to the plane of the substrate 122 held in the polishing head 204 and promotes global planarization of the substrate 122. The sub-plate 280 is positioned between the sub-pad 278 and the bottom of the recess 276 such that the upper surface of the sub-pad 278 is coplanar with the top surface 260 of the platen 230.

Both the sub-pad 278 and the sub-plate 280 optionally contain a plurality of apertures (not shown) that are generally disposed in a pattern such that the polishing motion of the substrate 122 does not cause a discrete portion of the substrate 122 to pass repeatedly over the apertures while polishing as compared to the other portions of the substrate 122. A vacuum port 284 is provided in the recess 276 and is coupled to an external pump 282. When a vacuum is drawn through the vacuum port 284, the air removed between the polishing material 252 and the sub-pad 278 causes the polishing material 252 to be firmly secured to the sub-pad 278 during polishing.

An example of such polishing material retention system is disclosed in U.S. Pat. No. 6,491,570, issued Dec. 10, 2002, of Sommer et al., which is hereby incorporated by reference. The reader should note that other types of devices might be utilized to fix the polishing material 252 to the platen 230, for example, adhesives, bonding, electrostatic chucks, mechanical clamps and other retention mechanisms.

Optionally, to assist in releasing the polishing material 252 from the sub-pad 278 and platen 230 prior to advancing the polishing material 252, surface tension caused by fluid that may be disposed between the sub-pad 278 and the polishing material 252, a blast of gas (e.g., air) may be provided through the vacuum port 284 or other port (not shown) into the recess 276 by the pump 282 (or other pump). The air pressure within the recess 276 moves through the apertures (not shown) disposed in the sub-pad 278 and sub-plate 280 and lifts the polishing material 252 from the sub-pad 278 and the top surface 260 of the platen 230. The polishing material 252 rides upon the cushion of air such that it may be freely indexed across the platen 230.

Alternatively, the sub-pad 278 may be a porous material that permits gas (e.g., air) to permeate therethrough and lift the polishing material 252 from the platen 230. Such a method for releasing the web 252 is described in U.S. patent application Ser. No. 09/676,395, filed Sep. 29, 2000, by Butterfield, et al., and is hereby incorporated by reference in its entirety.

Mounted to one side of the platen 230 is a supply roll 240. The supply roll 240 generally contains a portion of the web of polishing material 252 wound thereon. The web of polishing material 252 is fed over a lift member 242 of the lift assembly 108A and across the top surface 260 of the platen. The web of polishing material 252 is fed over a lift member 246 of the lift assembly 108B and to a take-up roll 248 disposed to the other side of the platen 230. The lift members 242, 246 may be a roller, a rod, a bar or other member configured to allow the web 252 to move thereover with minimal damage to the web, particulate generation or contamination of the web.

The supply roll 240 is removably coupled to the platen 230 to facilitate loading another unwind roll containing unused polishing article once the web of polishing material 252 is consumed over the course of polishing a number of substrates. The supply roll 240 is coupled to a slip clutch 250 or similar device that prevents the web of polishing material 252 from inadvertently unwinding from the supply roll 240.

A housing 254 that protects the supply roll 240 from damage and contamination covers the supply roll 240. To further prevent contamination of the supply roll 240, a gas is disposed in the volume between the housing 254 and the platen 230 which flows out a gap 256 defined between an edge 258 of the housing 254 and the web of polishing material 252 disposed on the lift member 242. The gas flowing through the gap 256 prevents contaminants such as polishing fluids and byproducts from coming in contact with the unused portion of the web of polishing material 252 disposed on the supply roll 240 enclosed by the housing 254.

The take-up roll 248 generally is removably coupled to the platen 230 to facilitate removal of used polishing article that is wound thereon. The take-up roll 248 is coupled to a tensioning device 262 that keeps the web of polishing material 252 taunt between the supply roll 240 and take-up roll 248. A housing 264 disposed over the take-up roll 248 protects the take-up roll 248 from damage and contamination.

The web of polishing material 252 is advanced between the supply roll 240 and take-up roll 248 by an indexing means 266. In one embodiment, the indexing means 266 comprises a drive roller 268 and an idler 270 that pinches the web of polishing material 252 therebetween. The drive roller 256 generally is coupled to the platen 230. The drive roller 256 is connected to a controlled motor such as a stepper and an encoder (motor and encoder not shown). The indexing means 266 enables a predetermined length of polishing material to be pulled off the supply roll 240 by drive roller 256 as the drive roller 256 is controllably rotated. The predetermined length is usually about 1 inch or less, such as about ¼ inch indexing between substrates. The web of polishing material 252 may be indexed and conditioned to provide effective polishing of about 5000 or more substrate according to the polishing process described herein. An example of a corresponding length of polishing material is about 100 feet in length. Additionally, the web of polishing material 252 may be conditioned before or after polishing the substrate by a conditioning apparatus, such as a conditioning disk.

Before the web of polishing material 252 is advanced across the platen 230, at least one of the lift assemblies 108A or 108B is raised to an extended position to maintain the web of polishing material 252 in a spaced-apart relation to the platen 230. In a spaced-apart relation, the web 252 may be freely advanced without having to overcome surface tension due to fluid disposed between the web and the platen or possibly creating particulate by contacting the backside of the web with the platen while the web is moving.

To facilitate control of the system as described above, the controller 190 may include a CPU 192 of FIG. 1, which CPU 192 may be one of any form of computer processors that can be used in an industrial setting for controlling various chambers and subprocessors. The memory 194 is coupled to the CPU 192. The memory 194, or computer-readable medium, may be one or more of readily available memory, such as random access memory (RAM), read only memory (ROM), floppy disk, hard disk, or any other form of digital storage, local or remote. For storing information and instructions to be executed by the CPU 192.

The support circuits 196 are coupled to the CPU 192 for supporting the processor in a conventional manner. These circuits include cache, power supplies, clock circuits, input/output circuitry and subsystems, and can include input devices used with the controller 190, such as keyboards, trackballs, a mouse, and display devices, such as computer monitors, printers, and plotters. Such controllers 190 are commonly known as personal computers; however, the present invention is not limited to personal computers and can be implemented on workstations, minicomputers, mainframes, and supercomputers.

A process, such as the polishing processes described below, is generally stored in the memory 194, typically as a software routine. The software routine may also be stored and/or executed by a second CPU (not shown) that is remotely located from the hardware being controlled by the CPU 192.

Chemical Mechanical Polishing Process

Chemical mechanical polishing of substrate surfaces with reduced or minimal delamination and/or defect formation can be achieved by initially contacting a substrate with a polishing article at a contact pressure of less than about 2 psi and at reduced platen and carrier head rotational rates and then accelerating the platen and carrier head rotational rates to processing conditions for polishing the substrate. Minimal delamination and/or defect formation can also be achieved by decelerating the platen and carrier head rotational rates prior to removing the substrate from contact with the polishing article.

Although the following disclosure describes the use of the aspects of the invention with a desired polishing process, the invention contemplates that multi-step polishing techniques, polishing techniques with variable or modulating process parameters, and conventional polishing techniques may be used in conjunction with the aspects of the invention described herein, and that the invention may be modified to achieve the needs of those techniques. Additionally, while the invention is described in relation to processing steps, the steps described herein should not be construed or interpreted as limiting the practice or scope of the invention. Further, while the following description is directed to high speed/low pressure polishing processes, the invention contemplates the aspects described herein to be used with conventional polishing processes.

While the following description describes the polishing of a conductive material, such as copper, the invention also contemplates the polishing of other materials including barrier layer materials, such as tantalum and tantalum nitride, as well as dielectric materials including low k dielectric material such as silicon carbide and carbon-doped silicon oxide. Further, while the following processes described herein may illustrate polishing the substrate on two platens, the invention contemplates polishing the substrate by the process described herein on apparatus having one or more platens. For example, the invention contemplates that the steps may be performed on the same platen or that portions of some process steps may be performed on multiple platens.

Figure 3:
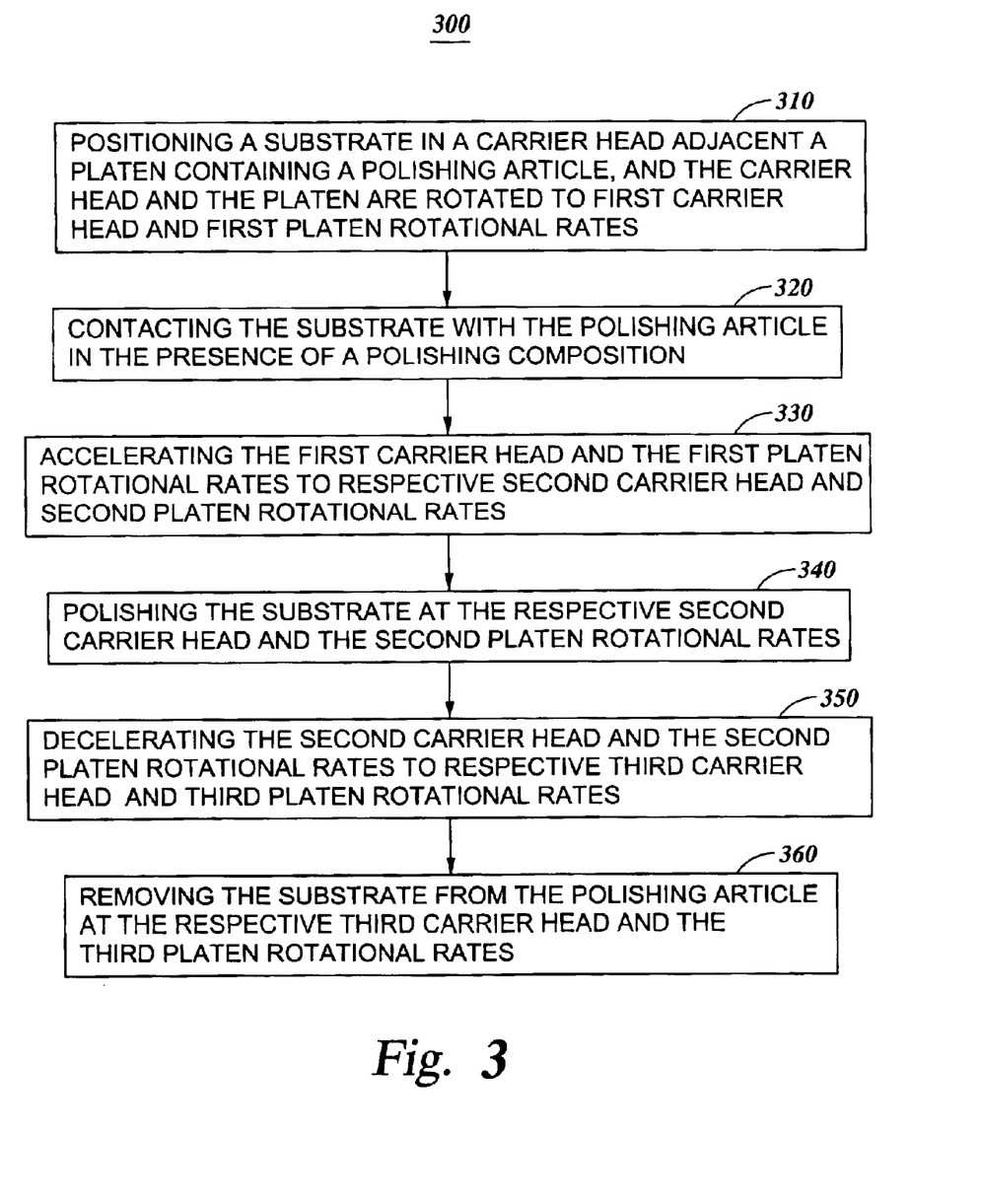
FIG. 3 is a flow chart illustrating the processing steps according to one embodiment of the invention.

FIG. 3 is a flow chart 300 illustrating one embodiment of a process for utilizing the processes described herein to remove materials disposed on a substrate in a high speed/low pressure polishing technique. A substrate is positioned in a carrier head adjacent a platen containing an abrasive-free or "conventional" polishing pad, or a fixed abrasive polishing article, and the carrier head and platen are rotated at first rotational rates respectively at step 310. The substrate is then contacted with the polishing article at step 320. The rotational rates of the platen and the carrier head are accelerated respectively to second rotational rates of the platen and the carrier head for performing the bulk polishing process at step 330. Materials are then removed from the surface of the substrate by polishing the substrate at the respective second rotational rates of the bulk polishing process at step 340. The bulk polishing process may be one or more polishing steps. The respective second rotational rates may then decelerated to respective third rotational rates at step 350. The substrate may then be removed from the polishing article at the respective third polishing rates at step 360.

Examples of substrates that may be polished according to the processes described herein may be formed by a process including etching feature definitions in a dielectric layer, depositing a barrier layer material on the substrate surface and in the feature definitions, and depositing a bulk copper-containing material over the substrate surface to fill the feature definitions.

As used throughout this disclosure, the phrase "copper-containing material", "copper" and the symbol Cu are intended to encompass high purity elemental copper as well as doped copper and copper-based alloys, e.g., doped copper and copper-based alloys containing at least about 80 wt. % copper. Bulk copper containing material is broadly defined herein as copper containing material deposited on the substrate in an amount more than sufficient to substantially fill features formed on the substrate surface. Residual copper containing materials is broadly defined as any bulk copper containing material remaining after one or more polishing process steps. Residual copper-containing material can include copper, copper alloys, copper oxides, and/or doped copper.

The barrier layer material includes tantalum, tantalum nitride, and derivatives thereof, such as tantalum silicon nitride. The invention described herein also contemplates the use of other barrier materials known or unknown that may be used as a barrier with conductive materials, such as copper.

The dielectric layer can comprise any of various dielectric materials known or unknown that may be employed in the manufacture of semiconductor devices. For example, dielectric materials, such as silicon dioxide, phosphorus-doped silicon glass (PSG), boron-phosphorus-doped silicon glass (BPSG), and carbon-doped silicon dioxide, can be employed. The dielectric layer can also comprise low dielectric constant (k) materials, including fluoro-silicon glass (FSG), polymers, such as polymides, and carbon-containing silicon oxides, such as Black Diamond™ dielectrics, or silicon carbides, such as BLOk™ dielectrics, available from Applied Materials, Inc. of Santa Clara, Calif. The openings are formed in interlayer dielectrics by conventional photolithographic and etching techniques. The invention also contemplates the use of dielectric materials, known or unknown that may be used as dielectric layers in semiconductor fabrication.

The processes described herein may be used in polishing techniques using low polishing pressures and high platen rotational rates, which have been observed to be effective in polishing conductive materials from substrates having low dielectric constant (k) materials (i.e., dielectric constants of about 4 or less.) at removal rates up to about 10000 Å/min with reduced or minimal damage, such as film delamination, to the underlying low k dielectric material and effective planarization of bulk copper materials with minimal dishing.

A copper layer disposed on a substrate surface as described herein may be polished in the first step 310 by positioning the substrate in a carrier head 170 adjacent a first platen containing a polishing article 100 disposed on platen 130 in polishing station 125*a*. The polishing article 100*a* is rotated at a first platen rotational rate of about 130 centimeters per second (cps) or less at the outer edge or average of a 20 inch rotating platen (about 100 rpm or less for a 20 inch platen), such as between about 26 cps and about 107 cps (about 20 rpm and about 80 rpm). The substrate disposed in the carrier head 170*a* is rotated at a first carrier head rotational rate of about 130 cps or less (about 100 rpm or less), such as between about 26 cps and about 107 cps (about 20 rpm and about 80 rpm). The platen rotation rates correspond to a linear velocity at the substrate polishing surface of about 475 ft/min or less, such as between about 90 ft/min and about 380 ft/min.

The substrate may be contacted with the polishing article 100*a* generally at a polishing pressure of less than about 2 psi, such as, between about 0.01 psi and about 1 psi, for example, between about 0.3 psi and about 1.0 psi, at step 320. A polishing pressure between about 0.5 psi and about 0.8 psi has been used with minimal or no delamination being observed.

The pressure may be varied during processing a substrate at one or more rotational speeds for any of the processing steps described herein. For example, pressure may be applied at a first pressure of between about 0.8 psi and about 1 psi during a first portion, for example, about one-half of the polishing process, and a second pressure less than the first pressure, for example, between about 0.5 psi and about 0.7 psi may be used for the second portion of the polishing process. In another example, the polishing process may have two pressure portions, a first pressure, and then a second pressure greater than the first pressure, contrary to the previously provided example. The polishing step may include 3 or more portions having variable polishing pressure for each step, with subsequent portions having pressure less than or greater than previous portions. A first portion may have a first pressure, the second portion has a second pressure greater than or less than the second pressure, and then a third portion has a third pressure less than or greater than the second and/or first portion, including, for example, a first pressure, a second portion having a second pressure greater than the first portion, and a third portion having a third pressure less than the second pressure, which may be less than or greater than the first portion.

The carousel 160 positions the substrate in contact with the polishing article 100*a*, and the substrate and the polishing article move relative to one another with a first polishing composition distributed between the substrate and the polishing article to effect chemical and mechanical activity on the substrate.

A polishing composition may be supplied to the polishing article 100*a* at a flow rate of about 100 ml/min or greater from a storage medium disposed near the CMP apparatus. Typically, a flow rate of between about 100 ml/min and about 300 ml/min may be supplied to the polishing article for polishing the substrate. The substrate is typically a 300 mm substrate, and the invention contemplates polishing substrates of other sizes, such as 200 mm substrates. Polishing parameters, such as flow rate, maybe modified to reflect the change in polishing size to be polished by the processes described herein.

Examples of suitable polishing compositions, including abrasive-containing polishing compositions, commercially available for removing copper-containing material in the first polishing step include EPC-5003, EPC-5001, EPC-600Y-75, and EPC-5306, available from Cabot Corp. of Aurora, Ill., and HS-C430-A3, HS-C430-A1, HS-C430-A22, HS-C430-A33, available from Hitachi Chemical Corp. of Japan, of which EPC-5001 is preferred. The abrasive-containing polishing compositions may include up to about 30 wt. % abrasives, for example, up to about 1 wt. % or less of abrasives.

The rotational rate of the platen 130 and the rotational rate of the carrier head 170 are accelerated respectively to a second platen rotational rate 130 and a second carrier head rotational rate for performing the main polishing process at step 330. The respective second rotational rates of the platen 130 and rotational head 170 are generally greater than the respective first rotational rates. The acceleration rates of the respective carrier head and platen rotational rates may be between about 6 cps/s (about 5 rpm/s) and about 80 cps/s (about 60 rpm/s), for example, about 40 cps/s (about 30 rpm/s). The acceleration rates may result in a linear acceleration of between about 1400 ft/min$^2$ and about 17,000 ft/min$^2$, for example, between about 8450 ft/min$^2$ and about 8500 ft/min$^2$, for a 300 mm platen. The linear acceleration and linear velocity described herein are described with regard to a 300 mm substrate rotational platen processing platform, such as the Reflexion LK™ described herein, and the invention contemplates that linear velocity may vary according to the processing platform including 200 mm substrate rotational platen processing platform, orbital platen platforms, and linear platen platforms.

The platen 125a may be accelerated to a platen rotational rate greater than about 160 cps (120 rpm), such as between about 200 cps and about 1000 cps (about 150 rpm and about 750 rpm, for example, between about 180 rpm and about 500 rpm), such as a platen rotational rate of between about 200 cps and about 350 cps (about 150 rpm and about 250 rpm). The substrate disposed in a carrier head system 170 may be accelerated to a carrier head rotational rate greater than about 160 cps (120 rpm), such as between about 200 cps and about 650 cps (between about 150 rpm and about 500 rpm, for example, between about 180 rpm and about 500 rpm), such as between about 400 cps and about 650 cps (about 300 rpm and about 500 rpm).

The platen rotation rates correspond to a linear velocity at the substrate polishing surface of greater than about 560 ft/min, such as between about 710 ft/min and about 3600 ft/min, for example, between about 840 ft/min and about 2350 ft/min, such as a platen rotational rate of between about 705 ft/min and about 1200 ft/min. The linear velocity of the substrate, also referred to as the relative linear velocity of the substrate, is usually considered the linear velocity at the center of the substrate. For a rotating substrate, the average relative linear velocity typically increases when measured further from the center of the substrate. Additionally, the relative linear velocity of the substrate increases as the substrate is moved from the center of a rotating polishing article. An example of a linear velocity at the rotational rates described herein may produce a linear velocity between about 560 ft/min (120 rpm for platen) and about 3600 ft/min (750 rpm for platen) at the center of a substrate displaced approximately 9 inches from a rotating polishing article axis of the platen (not shown).

The substrate may then be polished at the respective second carrier head and platen rotational rates described herein at the polishing composition flow rate described herein at step 340. A pressure of less than about 2 psi, such as: about 1.5 psi or less, for example, between about 0.01 psi and about 1 psi, is generally applied between the substrate and the polishing media during the polishing process. A polishing pressure between about 0.3 psi and about 1 psi may be used, for example, between about 0.5 psi and about 0.8 psi. The polishing pressure of the main polishing step may be greater than the initial or subsequent polishing steps described herein, and the polishing pressure for this step may also be the same polishing pressure as step 320. If a conventional polishing process is used, the polishing pressure may be up to about 6 psi.

The substrate and the polishing article are typically exposed to the polishing composition and contacted for a period of time sufficient to remove at least a portion or all of the bulk copper-containing material disposed thereon. For example, the polishing article may be exposed to the first polishing composition between about 2 seconds and about 500 seconds, such as between about 30 seconds and about 450 seconds, but may vary depending upon the material being removed, the concentration of the components of the first polishing composition, and the amount or thickness of bulk copper-containing material on the substrate. The copper-containing material may be removed at a rate between about 4000 Å/min and about 8,000 Å/min or any rate to remove the bulk copper-containing materials deposited on the substrate Further disclosures of a high speed/low pressure polishing process for conductive and barrier materials are more fully described in U.S. Pat. Ser. No. 10/199,444, filed on Jul. 19, 2002, and U.S. Pat. Ser. No. 10/187,857, filed on Jun. 27, 2002, which are incorporated by reference to the extent not inconsistent with the claimed aspects and disclosure herein.

The polishing composition may be supplied to the polishing platen at a flow rate of about 50 ml/min or greater, such as between about 50 ml/min and about 500 ml/min, for example, between about 100 ml/min and about 300 ml/min. Polishing compositions may be used in the processes described herein may contain abrasives or be abrasive free, and the polishing articles may be conventional polishing article materials or fixed-abrasive polishing article materials. The polishing process may be selective to one or more materials or may be non-selective to the materials deposited on the substrate surface.

An example of a suitable polishing composition includes EPC-5001, which is commercially available from Cabot Corp. of Aurora, Ill. that may be delivered to conventional polishing article, such as an IC-1000, commercially available from Rodel Inc., of Phoenix Ariz. The process and polishing composition may be used to remove copper material at a higher removal rate than the barrier layer material. For example, polishing the substrate surface with the EPC-5001 slurry by the process described herein was observed to have a removal rate ratio, or selectivity, of copper to barrier material of about 20:1. The composition and process parameters may be chosen to provide selectivities of copper to barrier of about 10:1 or greater to effectively remove copper material with reduced or minimal barrier layer removal. The polishing composition may be an abrasive-containing polishing composition having up to about 1 wt. %, for example, such as between about 0.1 wt. % and about 0.5 wt. % of abrasives may be used. The low pressure/high platen rotational rate polishing process may remove copper-containing materials a rate of about 2500 Å/min or greater, such as between about 3000 Å/min and about 8000 Å/min, for example 4500 Å/min. Alternatively, the low pressure/high platen rotational rate polishing process may be integrated into a multi-step polishing process.

Additionally, while the processing parameters are generally described for polishing 300 mm substrates, the invention contemplates modifying processing parameters to satisfy the requirements for polishing substrates of different sizes, such as 200 mm substrates, and polishing on various apparatus, such as orbital motion polishing apparatus. The process described below should be considered illustrative, and should not be construed or interpreted as limiting the scope of the invention.

The rotational rate of the platen 130 and the rotational rate of the carrier head 170 are decelerated respectively to a third platen rotational rate 130 and a third carrier head rotational rate for performing the main polishing process at step 350. The respective third rotational rates of the platen 130 and rotational head 170 are less than the respective second rotational rates and may be equal to the respective first rotational rates.

The deceleration rates of the respective carrier head and platen rotational rates may be between about 6 cps/s (about 5 rpm/s) and about 80 cps/s (about 60 rpm/s), for example, about 40 cps/s (about 30 rpm/s). The deceleration rates may result in a linear acceleration of between about 1400 ft/min$^2$ and about 17,000 ft/min$^2$, for example, between about 8450 ft/min$^2$ and about 8500 ft/min$^2$, for a 300 mm platen.

The polishing article 100a may be rotated at a third platen rotational rate of about 130 cps or less (about 100 rpm or less for a 20 inch platen), between about 26 cps and about 107 cps (about 20 rpm and about 80 rpm). The substrate disposed in the carrier head 170a may be rotated at a third carrier head rotational rate of about 130 cps or less (about 100 rpm or less), between about 26 cps and about 107 cps (about 20 rpm and about 80 rpm). The platen rotation rates correspond to a linear velocity at the substrate polishing surface of about 475 ft/min or less, such as between about 90 ft/min and about 380 ft/min. Any remaining residual materials may also be removed at the polishing pressures and respective third carrier head and platen rotational rates.

At the respective third carrier head and platen rotational rates, the substrate may be contacted with the polishing article 100a generally at a polishing pressure of less than about 2 psi, such as, between about 0.01 psi and about 1 psi, for example, between about 0.5 psi and about 1.0 psi, as at step 320. The polishing pressure at the step 350 may be less than the polishing pressure at step 340. The substrate may then be removed from the polishing article 100a at the respective third polishing rates at step 360.

A cleaning solution may be applied to the polishing substrate surface to remove surface defects and particles adhering to the substrate surface. The cleaning solution, or subsequent cleaning step, may contain a corrosion inhibitor, such as benzotriazole (BTA), to form a protective coating on the exposed substrate surface prior to substrate handling or expose to oxidizing environments.

Following conductive material removal, the barrier layer may be selectively removed in relation to the copper and dielectric materials, i.e., remove the barrier layer at higher removal rates than the copper or dielectric materials, or the barrier layer composition may non-selectively remove the copper, barrier, and dielectric materials at approximately equal rates. The barrier layer may also be polished according to the acceleration, polish, deceleration process described herein.

The substrate may then be rinsed following barrier layer removal to remove surface defects and particles adhering to the substrate surface. The above processing steps may be performed on the same apparatus or may be performed on more than one apparatus. Additionally, the substrate may be transferred to a cleaning module or subjected to an in situ cleaning process to also remove surface defects, such as oxides that form on the copper-containing material.

In one example of barrier layer removal, the barrier layer may be removed on the third platen by positioning the substrate on the third platen containing a polishing article 100c, and typically includes positioning a substrate on the third polishing article 100c disposed on platen 130 in polishing station 125c, supplying a barrier removal polishing composition to the polishing article 100 and contacting the polishing media and substrate to remove barrier layer materials, such as tantalum containing materials, from the surface of the substrate by a polishing process on the substrate.

The polishing article 100c is rotated at a rate between about 65 cps (about 50 rpm, about 235 ft/min) and about 155 cps (about 120 rpm, about 565 ft/min) for a polishing article disposed on a rotatable platen. The substrate disposed in a carrier head system 170 is rotated at a rate between about 65 cps (about 50 rpm, about 235 ft/min) and about 155 cps (about 120 rpm, about 565 ft/min). The polishing article and substrate are rotated in the same direction to provide a relative motion between one another. A pressure between about 0.5 psi and about 6 psi between the substrate and the polishing article 100c is used to provide mechanical activity to the polishing process.

The barrier layer polishing composition is delivered or supplied to the polishing article at a flow rate of about 100 ml/min or greater from a storage medium disposed near the CMP apparatus. Examples of suitable polishing compositions, including abrasive-containing polishing compositions and abrasive-free polishing compositions, commercially available for removing barrier layer material include HS-T605 and HS-T505, available from Hitachi Chemical Corp. of Japan.

Examples of suitable polishing compositions are disclosed in U.S. patent application Ser. No. 10/187,857, filed on Jun. 27, 2002, and U.S. patent application Ser. No. 10/193,810, filed on Jul. 11, 2002, which are incorporated herein by reference to the extent not inconsistent with the claimed aspects and disclosure herein.

The substrate and the polishing article are typically exposed to the polishing composition and contacted for a period of time sufficient to remove the barrier layer material, for example between about 60 seconds and about 600 seconds. The barrier layer materials may be removed at a rate up to about 1200 Å/min.

Alternatively, the barrier layer may be polished by the accelerating and decelerating polishing processes described herein, for example, according to the copper polishing processes described above for steps 310–360.

Optionally, a cleaning solution may be applied to each of the polishing articles during or subsequent each of the polishing process to remove particulate matter and spent reagents from the polishing process as well as help minimize metal residue deposition on the polishing articles and defects formed on a substrate surface. An example of a suitable cleaning solution is Electra Clean™ commercially available from Applied Materials, Inc. of Santa Clara, Calif.

EXAMPLE

An example of a copper polishing process according to aspects of the invention described herein is as follows. A 300 mm substrate including a low k dielectric material, such as Black Diamond™ dielectric materials or BLOk™ dielectric materials from Applied Materials, Inc. of Santa Clara, Calif., with feature definitions formed therein, a tantalum barrier layer deposited on the dielectric layer and in the feature definitions formed therein, and a copper-containing layer deposited on the barrier layer and filling the feature definitions formed therein is provided to the polishing apparatus disclosed above.

A polishing article, such as an IC-1000 polishing article, is cleaned by applying a cleaning solution to the surface of the polishing article at a flow rate of about 300 ml/min for a period of about 9 seconds while rotating the platen at about 65 rpm (about 305 ft/min) and then ending the application of the cleaning solution and rotating the platen at a rotational rate between about 25 rpm (about 118 ft/min) and about 65 rpm (about 305 ft/min) for about 6 seconds.

The copper polishing process may be performed by positioning the substrate over the IC-1000 polishing article of the platen, and delivering a polishing composition, for example, Cabot EPC-5001, to the polishing article at a flow rate between about 150 ml/min and about 250 ml/min, for example, about 200 ml/min. The platen is rotated at a platen rotational rate of about 33 cps (about 25 rpm, about 118 ft/min) and the carrier head is rotated at a rotational rate of about 34 cps (about 26 rpm). The substrate is contacted with the polishing article at a polishing pressure between about 0.5 psi and about 1.0 psi, for example 0.5 psi, is applied between a substrate and polishing article. The substrate is polished at this platen rotational rate and pressure for about 2 seconds and about 30 seconds.

The platen and carrier head rotational rates are then accelerated to rotate the platen at a rotational rate greater than about 160 cps (about 120 rpm, about 565 ft/min), such as between about 200 cps and about 240 cps (between about 150 rpm, about 705 ft/min and about 180 rpm, about 850 ft/min), for example, about 150 rpm, at an acceleration rate of about 30 rpm/s (about 8500 ft/min$^2$), to rotate the carrier head at a rotational rate of about 200 cps and about 240 cps (between about 152 rpm and about 182 rpm), for example, about 152 rpm, at an acceleration rate of about 30 rpm/s, and at a polishing pressure between about 0.5 psi and about 1.0 psi, for example, about 0.8 psi. The carrier head and the platen are accelerated for about 5 seconds at an acceleration rate of about 30 rpm/s (about 8500 ft/min$^2$) at a contact pressure of about 0.5 psi, the substrate is polished at a platen rotational rate of greater than about 160 cps (about 120 rpm, about 565 ft/min), such as about 150 rpm and carrier head rotational rate greater than about 160 cps (about 120 rpm), such as about 152 rpm at a pressure of about 0.8 psi for about 150 seconds. The substrate may then be polished at a downforce pressure of about 0.5 psi for about 2 seconds prior to any deceleration of rotational rates. The polishing composition is delivered to the polishing article at a flow rate between about 150 ml/min and about 250 ml/min, for example, about 200 ml/min.

The platen and carrier head rotational rates are then decelerated to rotate the platen at platen rotational rate of about 86 cps (about 65 rpm, about 306 ft/min) by a deceleration rate of about 30 rpm/s (about 8500 ft/min$^2$), to rotate the carrier head at a rotational rate of about 88 cps cps (about 66 rpm) by a deceleration rate of about 30 rpm/s. The deceleration is performed for about 3 seconds at a polishing pressure between about 0.5 psi and about 1.0 psi, for example, about 0.5 psi. The substrate may be polished at a reduced carrier head rotational rate of about 66 rpm and reduced platen rotational rate of about 65 rpm (about 306 ft/min) for about 3 seconds prior to removal of the substrate. A post-polishing composition, such as a cleaning agent or anti-oxidant agent, for example, a solution containing BTA to prevent corrosion of exposed features in oxidizing environments, may be applied during the deceleration phase. The substrate may then be removed from the surface of the polishing article.

Any remaining copper material may be removed in a second processing step including positioning the substrate over the IC-1000 polishing article of the platen, and delivering a polishing composition, which may be the same or different composition, to the polishing article at a flow rate between about 150 ml/min and about 350 ml/min, for example, about 300 ml/min. The platen is rotated at a platen rotational rate of about 33 cps (about 25 rpm, about 118 ft/min) and the carrier head is rotated at a rotational rate of about 34 cps (about 26 rpm). The substrate is contacted with the polishing article at a polishing pressure between about 0.5 psi and about 1.0 psi, for example, about 0.5 psi. The substrate is polished at this platen rotational rate and pressure for about 2 seconds and about 30 seconds.

The platen and carrier head rotational rates are then accelerated to rotate the platen at a rotational rate of about 52 cps and about 133 cps (between about 40 rpm, about 190 ft/min and about 100 rpm, 471 ft/min) at an acceleration rate of about 30 rpm/s (about 8500 ft/min$^2$), to rotate the carrier head at a rotational rate of about 52 cps and about 133 cps (between about 40 rpm and about 100 rpm), at an acceleration rate of about 30 rpm/s, and at a polishing pressure between about 0.5 psi and about 1.0 psi, for example, about 0.8 psi. The carrier head and the platen are accelerated for about 2 seconds at an acceleration rate of about 30 rpm/s at a contact pressure of about 0.5 psi, the substrate is polished at a platen rotational rate of about 65 rpm (about 306 ft/min) and carrier head rotational rate of about 66 rpm at a pressure between about 0.5 psi and about 1 psi, for example, about 0.8 psi for about 455 seconds. The polishing step may be performed in two or more portions at a consistent carrier head and platen rotational speed but with variable contact pressures, as a further example, the substrate is polished as the described rotational rates at a first pressure of about 0.5 psi for about 2 seconds, a pressure between about 0.8 and about 1 for about 230 seconds, a pressure between about 0.5 psi and about 0.7 psi for about 225 seconds. The polishing composition is delivered to the polishing article at a flow rate between about 100 ml/min and about 350 ml/min, for example, about 300 ml/min.

The platen and carrier head rotational rates are then decelerated to rotate the platen at platen rotational rate of about 86 cps (about 65 rpm, about 306 ft/min) by a deceleration rate of about 30 rpm/s (about 8500 ft/min$^2$), to rotate the carrier head at a rotational rate of about 88 cps (about 66 rpm) by a deceleration rate of about 30 rpm/s. The deceleration is performed for about 2 seconds at a polishing pressure between about 0.5 psi and about 1.0 psi, for example, about 0.8 psi. The substrate may be polished at a reduced carrier head rotational rate of about 26 rpm and reduced platen rotational rate of about 25 rpm (about 118 ft/min) for about 3–5 seconds. A post-polishing composition, such as a cleaning agent or anti-oxidant agent, for example, a solution containing BTA to prevent corrosion of exposed features in oxidizing environments, may be applied during the deceleration phase. The substrate may then be removed from the surface of the polishing article.

The substrate may then be transferred to another platen for barrier material and/or dielectric polishing. The third platen may comprise a hard or soft polishing pad, for example a soft Politex polishing article disposed thereon. A barrier layer polishing composition is delivered to the polishing article to remove the barrier layer material and planarize the surface of the substrate. The barrier layer polishing composition is provided at a flow rate of about 200 ml/min, the platen is rotated at a speed of about 120 cps (about 93 rpm, about 440 ft/min), the carrier head is rotated at a speed of about 110 cps (about 87 rpm), and a pressure of about 2 psi is applied between a substrate and polishing article. The substrate is then polished for a requisite amount of time at a rate up to about 1200 Å/minute to sufficiently remove the barrier layer materials. An Electra Clean™ solution is then used to clean the substrate surface following the polishing processes. Alternatively, the substrate may be treated with a solution containing BTA to prevent corrosion of exposed features in oxidizing environments.

Alternatively, the barrier layer and/or dielectric polishing may be performed as follows. The substrate may then be transferred to another platen having a suitable barrier polishing article, such as the Politex polishing article disposed thereon for barrier polishing, dielectric polishing and any buffing required.

The barrier/dielectric polishing process may be performed by positioning the substrate over the polishing article of the platen, and delivering a barrier polishing composition to the polishing article at a flow rate between about 100 ml/min and about 300 ml/min, for example, about 250 ml/min. The platen is rotated at a platen rotational rate of about 33 cps (about 25 rpm, about 118 ft/min) and the carrier head is rotated at a rotational rate of about 34 cps (about 26 rpm). The substrate is contacted with the polishing article at a polishing pressure between about 0.5 psi and about 1.0 psi, for example, about 0.5 psi, is applied between a substrate and polishing article. The substrate is polished at this platen rotational rate and pressure for about 2 seconds and about 30 seconds.

The platen and carrier head rotational rates are then accelerated to rotate the platen at a rotational rate greater than about 160 cps (about 120 rpm, about 565 ft/min), such as between about 200 cps and about 240 cps (between about 150 rpm, about 705 ft/min and about 180 rpm, about 850 ft/min), for example, about 180 rpm, at an acceleration rate of about 30 rpm/s (about 8500 ft/min$^2$), to rotate the carrier head at a rotational rate of about 200 cps and about 240 cps (between about 152 rpm and about 182 rpm), for example, about 182 rpm, at an acceleration rate of about 30 rpm/s, and at a polishing pressure between about 0.5 psi and about 1.0 psi, for example between about 0.8 psi and about 1.0 psi. The carrier head and the platen are accelerated for about 5 seconds at an acceleration rate of about 30 rpm/s at a contact pressure of about 0.8 psi, the substrate is polished at a platen rotational rate of about 180 rpm and carrier head rotational rate of about 182 rpm at a pressure of about 0.8 psi for about 67 seconds. The polishing step may be performed in two or more portions at a consistent carrier head and platen rotational speed but with variable contact pressures, as a further example, the substrate is polished as the described rotational rates at a first pressure of about 0.5 psi for about 5 seconds, a pressure between about 0.8 and about 1 for about 60 seconds, a pressure of about 0.5 psi for about 2 seconds. The polishing composition is delivered to the polishing article at a flow rate between about 250 ml/min and about 300 ml/min.

The platen and carrier head rotational rates are then decelerated to rotate the platen at platen rotational rate of about 86 cps (about 65 rpm, about 306 ft/min) by a deceleration rate of about 30 rpm/s (about 8500 ft/min$^2$), to rotate the carrier head at a rotational rate of about 88 cps (about 66 rpm) by a deceleration rate of about 30 rpm/s. The deceleration is performed between about 2 and about 5 seconds at a polishing pressure between about 0.5 psi and about 1.0 psi, for example, about 0.5 psi. The substrate may be polished at a reduced carrier head rotational rate of about 65 rpm and reduced platen rotational rate of about 65 rpm between about 2 and about 5 seconds. A post-polishing composition, such as a cleaning agent or anti-oxidant agent, for example, a solution containing BTA to prevent corrosion of exposed features in oxidizing environments, may be applied during the deceleration phase. The substrate may then be removed from the surface of the polishing article.

While the foregoing is directed to embodiments of the present invention, other and further embodiments of the invention may be devised without departing from the basic scope thereof, and the scope thereof is determined by the claims that follow.

What is claimed is:

1. A method for processing a substrate having a conductive material formed thereon, comprising:
   positioning the substrate in a polishing apparatus having a rotational carrier head and a rotatable platen, wherein the substrate is disposed in the rotational carrier head and the platen has a polishing article disposed thereon;
   rotating the carrier head at a first carrier head rotational rate and rotating the platen at a first platen rotational rate;
   contacting the substrate with the polishing article at a polishing pressure of less than about 2 psi;
   accelerating the first carrier head rotational rate to a second carrier head rotational rate and accelerating the first platen rotational rate to a second platen rotational rate; and
   removing a substantial portion of the conductive material from the substrate at the second carrier head rotational rate and at the second platen rotational rate.

2. The method of claim 1, further comprising decelerating the second carrier head rotational rate to a third carrier head rotational rate and decelerating the second platen rotational rate to a third platen rotational rate.

3. The method of claim 2, further comprising removing the substrate from contact with the platen.

4. The method of claim 2, wherein the third platen rotational rate is less than about 100 rpm and the third carrier head rotational rate is less than about 100 rpm.

5. The method of claim 2, wherein the decelerating the second carrier head rotational rate is at an deceleration rate between about 5 rpm/s and about 60 rpm/s and the decelerating the second platen rotational rate is at an deceleration rate between about 5 rpm/s and about 60 rpm/s.

6. The method of claim 1, wherein the first platen rotational rate is less than about 100 rpm and the first carrier head rotational rate is less than about 100 rpm.

7. The method of claim 1, wherein the second platen rotational rate is between greater than about 120 rpm and about 750 rpm or less and the second carrier head rotational rate is between greater than about 120 rpm and about 500 rpm or less.

8. The method of claim 1, wherein the accelerating the first carrier head rotational rate is at an acceleration rate between about 5 rpm/s and about 60 rpm/s.

9. The method of claim 1, wherein the accelerating the first platen rotational rate is at an acceleration rate between about 5 rpm/s and about 60 rpm/s.

10. The method of claim 1, wherein the polishing pressure is between about 0.01 psi and about 1 psi.

11. The method of claim 1, wherein the polishing pressure is between about 0.5 psi and about 0.8 psi.

12. The method of claim 1, wherein the first carrier head rotational rate is between greater than about 120 rpm and about 500 rpm or less, and the second carrier head rotational rate is less than about 100 rpm.

13. The method of claim 12, wherein the decelerating the first carrier head rotational rate is at an deceleration rate between about 5 rpm/s and about 60 rpm/s and the decelerating the first platen rotational rate is at an deceleration rate between about 5 rpm/s and about 60 rpm/s.

14. The method of claim 1, wherein the first platen rotational rate is between greater than about 120 rpm and about 750 rpm or less, and the second platen rotational rate is less than about 100 rpm.

15. The method of claim 1, where the polishing pressure is between about 0.01 psi and about 1 psi.

16. A method for processing a substrate having a conductive material formed thereon, comprising:
   positioning the substrate in a rotational carrier head;
   rotating the rotational carrier head at a carrier head rotational rate of about 80 rpm or less;
   rotating a platen at a platen rotational rate of about 80 rpm or less, wherein the platen has a polishing article disposed thereon;
   contacting the substrate and the polishing article at a polishing pressure between about 0.1 psi and less than about 2 psi;
   rotating the rotational carrier head at a carrier head rotational rate between greater than about 120 rpm and about 500 rpm or less;
   rotating the platen at a platen rotational rate between greater than about 120 rpm and about 750 rpm or less; and
   removing a substantial portion of the conductive material from the substrate.

17. The method of claim 16, further comprising rotating the carrier head at a carrier head rotational rate of about 80 rpm or less and rotating the platen at a platen rotational rate of about 80 rpm or less.

18. The method of claim 17, further comprising removing the substrate from contact with the platen.

19. The method of claim 16, wherein the substrate and the polishing article are contacted at a pressure between about 0.1 psi and about 1 psi.

20. A method for processing a substrate a substrate having a conductive material formed thereon, comprising:
   contacting the substrate with a polishing article at a polishing pressure of less than about 2 psi to remove a substantial portion of the conductive material, wherein the substrate is disposed in a carrier head having a first carrier head rotational rate and the substrate is contacted with a polishing material disposed on the platen having a first platen rotational rate;
   decelerating the first carrier head rotational rate to a second carrier head rotational rate less than the first carrier head rotational rate;
   decelerating the first platen rotational rate to a second platen rotational rate less than the first platen rotational rate; and
   removing the substrate from contact with the polishing material disposed on the platen.

21. A method for processing a substrate having a conductive material formed thereon, comprising:
   positioning the substrate in a polishing apparatus having a rotational carrier head and a platen, wherein the substrate is disposed in the rotational carrier head and the platen has a polishing article disposed thereon;
   rotating the carrier head at a first carrier head rotational rate and providing a first linear velocity;
   contacting the substrate with the polishing article at a polishing pressure of less than about 2 psi;
   accelerating the carrier head rotational rate to a second carrier head rotational rate and accelerating the first linear velocity to a second linear velocity; and
   removing a substantial portion of the conductive material from the substrate at the second carrier head rotational rate and at the second linear velocity.

22. The method of claim 21, further comprising decelerating the second carrier head rotational rate to a third carrier head rotational rate and decelerating the second linear velocity to a third linear velocity.

23. The method of claim 22, further comprising removing the substrate from contact with the platen.

24. The method of claim 22, wherein the third linear velocity is less than about 471 ft/mm and the third carrier head rotational rate is less than about 100 rpm.

25. The method of claim 22, wherein the decelerating the second carrier head rotational rate is at an deceleration rate between about 5 rpm/s and about 60 rpm/s and the decelerating the second linear velocity is at an deceleration rate between about 1400 ft/mm$^2$ and about 17000 ft/mm$^2$.

26. The method of claim 21, wherein the first linear velocity is less than about 471 ft/mm and the first carrier head rotational rate is less than about 100 rpm.

27. The method of claim 21, wherein the second linear velocity is between greater than about 560 ft/mm and about 3500 ft/mm or less and the second carrier head rotational rate is between greater than about 120 rpm and about 500 rpm or less.

28. The method of claim 21, wherein the accelerating the first carrier head rotational rate is at an acceleration rate between about 5 rpm/s and about 60 rpm/s.

29. The method of claim 21, wherein the accelerating the first linear velocity is at an acceleration rate between about 1400 ft/mm$^2$ and about 17000 ft/mm$^2$.

30. The method of claim 21, wherein the polishing pressure is between about 0.01 psi and about 1 psi.

31. The method of claim 30, wherein the polishing pressure is between about 0.5 psi and about 0.8 psi.

* * * * *

UNITED STATES PATENT AND TRADEMARK OFFICE
CERTIFICATE OF CORRECTION

PATENT NO. : 7,037,174 B2
APPLICATION NO. : 10/678906
DATED : May 2, 2006
INVENTOR(S) : Yufei Chen et al.

It is certified that error appears in the above-identified patent and that said Letters Patent is hereby corrected as shown below:

In the Specification

Column 4, Line 21: Delete the comma after "Inc."

Column 4, Line 37: Before "process", change "is" to --in--

Column 4, Line 60: After "drive;" insert --)--

Column 8, Line 64: Change "taunt" to --taut--

Column 12, Line 33: Change "maybe" to --may be--

Column 13, Line 36: Delete the colon after "as"

Column 13, Line 61: Insert a period after "substrate"

Column 17, Line 26: Delete the second instance of "cps"

In the Claims

Column 20, Claim 5, Lines 11 and 13: Before each instance of "deceleration", change "an" to --a--

Column 20, Claim 12, Line 33: Change "1" to --20--

Column 20, Claim 13, Lines 38 and 40: Before each instance of "deceleration", change "an" to --a--

Column 20, Claim 14, Line 42: Change "1" to --20--

Column 20, Claim 15, Line 46: Change "1" to --20--

Column 21, Claim 20, Line 10: Delete the second instance of "a substrate"

Column 22, Claim 24, line 12: Change "ft/mm" to --ft/min--

Column 22, Claim 25, Lines 16 and 18: Before each instance of "deceleration", change "an" to --a--

Column 22, Claim 25, Line 19: Change each instance of "ft/mm$^2$" to --ft/min$^2$--

UNITED STATES PATENT AND TRADEMARK OFFICE
CERTIFICATE OF CORRECTION

| | |
|---|---|
| PATENT NO. | : 7,037,174 B2 |
| APPLICATION NO. | : 10/678906 |
| DATED | : May 2, 2006 |
| INVENTOR(S) | : Yufei Chen et al. |

It is certified that error appears in the above-identified patent and that said Letters Patent is hereby corrected as shown below:

Column 22, Claim 26, Line 21: Change "ft/mm" to --ft/min--

Column 22, Claim 27, Lines 24 and 25: Change each instance of "ft/mm" to --ft/min--

Column 22, Claim 29, Line 34: Change each instance of "ft/mm$^2$" to --ft/min$^2$--

Signed and Sealed this

Fourteenth Day of November, 2006

JON W. DUDAS
*Director of the United States Patent and Trademark Office*